United States Patent
Min et al.

(10) Patent No.: US 7,706,192 B2
(45) Date of Patent: Apr. 27, 2010

(54) VOLTAGE GENERATING CIRCUITS FOR SEMICONDUCTOR MEMORY DEVICES AND METHODS FOR THE SAME

(75) Inventors: Young-Sun Min, Seoul (KR); Dong-Il Seo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 133 days.

(21) Appl. No.: 12/010,465

(22) Filed: Jan. 25, 2008

(65) Prior Publication Data

US 2008/0212381 A1  Sep. 4, 2008

(30) Foreign Application Priority Data

Jan. 25, 2007  (KR) ...................... 10-2007-0007788

(51) Int. Cl.
*G11C 5/01* (2006.01)

(52) U.S. Cl. .................. 365/189.06; 365/226; 365/227; 365/228; 365/229

(58) Field of Classification Search ............ 365/189.09, 365/226, 189.11, 227, 228, 229
See application file for complete search history.

(56) References Cited

U.S. PATENT DOCUMENTS

| 5,444,362 | A  | * | 8/1995  | Chung et al. | ................. | 323/313   |
| 6,636,451 | B2 | * | 10/2003 | Park et al.  | ................... | 365/226   |
| 7,319,626 | B2 | * | 1/2008  | Cheon        | ........................ | 365/203   |
| 7,525,863 | B2 | * | 4/2009  | Park         | ........................ | 365/225.7 |

FOREIGN PATENT DOCUMENTS

KR   100173950   11/1998

* cited by examiner

*Primary Examiner*—Pho M. Luu
(74) *Attorney, Agent, or Firm*—Harness, Dickey & Pierce, P.L.C.

(57) ABSTRACT

In a voltage generating circuit for a semiconductor memory device, each of a plurality of reset signal generators individually generates a reset signal in response to one of a plurality of external source voltages. The plurality of external source voltages have different voltage levels. An output voltage generator generates a plurality of output voltages by independently driving each of the plurality of external source voltages in response to a corresponding one of the plurality of reset signals. The output voltage generator outputs the plurality of output voltages through a common output terminal.

17 Claims, 17 Drawing Sheets

FIG.2 (CONVENTIONAL ART)

Condition : VDD1>VDD2

| VDD1 | VDD2 | Define |
|---|---|---|
| Internal Generator (VPP) | Internal Generator (Peri/Core IVC) | Case 1 |
| Internal Generator (VPP) | Direct Power Supply (VDD2) | Case 2 |
| Direct Power Supply (VDD1) | Internal Generator (Peri/Core IVC) | Case 3 |
| Direct Power Supply (VDD1) | Direct Power Supply (VDD2) | Case 4 |
| Internal Generator (VPP) | Direct Power Supply (VDD2) Internal Power Supply (Core IVC) | Case 5 |
| Direct Power Supply (VDD1) | Direct Power Supply (VDD2) Internal Power Supply (Core IVC) | Case 6 |

US 7,706,192 B2

VOLTAGE GENERATING CIRCUITS FOR SEMICONDUCTOR MEMORY DEVICES AND METHODS FOR THE SAME

PRIORITY STATEMENT

This nonprovisional U.S. patent application claims priority under 35 U.S.C. §119 of Korean Patent Application 10-2007-0007788 filed on Jan. 25, 2007, the entire contents of which is incorporated herein by reference.

BACKGROUND

Description of the Related Art

As semiconductor memory devices become more integrated and increase in speed, generating and distributing the voltage becomes increasingly important. Semiconductor memory devices such as a dynamic random access memory (DRAM) used in, for example, mobile electronic systems such as a notebook computer, portable multimedia player (PMP), etc., may require multiple external source voltages. For example, a first external source voltage may be used to generate a relatively high voltage for driving word lines, and a second external source voltage may be used to generate a voltage for DC power of a peripheral circuit or core circuit.

A conventional semiconductor memory device may include an internal source voltage generator for lowering a voltage to a given level and generating internal source voltage IVC for operating the semiconductor memory device. In such a conventional semiconductor memory device, a reference voltage generator may generate a reference voltage for operating the internal source voltage generator, and a high voltage (VPP) generator may be needed to apply a boosted voltage to a word line of a memory cell. A level shifter may shift a voltage of first level to a voltage of second level, etc. When the multiple source voltages are received and a voltage required for the device is generated, an undesired current path may be produced by a power-up speed difference between the multiple source voltages.

FIG. 1 is a block diagram of voltage supply system in a conventional semiconductor memory device. FIG. 2 illustrates a table of example cases of a voltage supply shown in FIG. 1. FIGS. 3-9 illustrate portions of the conventional voltage supply system of FIG. 1. FIGS. 10 and 11 illustrate example timings of voltage waveforms for the conventional voltage supply system.

Referring to FIG. 1, first and second external source voltages VDD1 101 and VDD2 103 may have different voltage levels. The first external source voltage VDD1 101 may be directly supplied to a circuit 201 using high voltage VPP through a supply line L10. The second external source voltage VDD2 103 may be directly supplied to a peripheral circuit or core circuit 203 using an internal source voltage through a supply line L11. Regions A1 and A2 constitute a distribution system. The distribution system A1 and A2 may supply power using an internal DC generator. An on/off signal output from the high voltage level detector 102 within the block region A1 may be applied to a high pumping circuit 202 as a pumping activation signal. The high voltage pumping circuit 202 may supply a pumping voltage to the circuit 201.

The reset signal generator 104 for generating a reset signal in response to the second external source voltage VDD2 may apply the reset signal to a PDPDE generator 105 for generating a power-down (DPD) control signal. The PDPDE generator 105 may apply the generated power-down (DPD) control signal to a reference voltage generator 205. The reference voltage generator 205 may be disabled in response to the power-down (DPD) control signal when the power-down (DPD) control signal has a first state (e.g., a logic high), and may be enabled in response to the power-down (DPD) control signal when the power-down (DPD) control signal has a second state (e.g., a logic low). When enabled, the reference voltage generator 205 may supply a reference voltage to a voltage driver 206 and the high voltage level detector 102. An output voltage driven by the voltage driver 206 may be supplied to the peripheral circuit/core circuit 203 and an internal reset circuit 207. The internal reset circuit 207 may generate an internal reset signal and apply the internal reset signal to the peripheral circuit/core circuit 203.

In the voltage supply system of FIG. 1, examples of the voltage supply are shown in the table of FIG. 2. With regard to the six cases shown in FIG. 2, a voltage level of the first external source voltage VDD1 is assumed to be higher than a voltage level of the second external source voltage VDD2. The voltage VPP in the table represents a pumping level inside the device using the VDD1. Peri/Core IVC represents a level of voltage generated inside the device using the second external source voltage VDD2. As illustrated in the table of FIG. 2, in a first case, a first external source voltage VDD1 is applied to an internal DC generator to obtain VPP and second external source voltage VDD2 is applied to the internal DC generator to obtain a Peri/Core IVC.

When power-up speeds of the first and second external source voltage VDD1 and VDD2 are different, a current path may be produced in internal circuit devices of a semiconductor memory device. For example, when applied voltages VDD2, PERI/CORE IVC, VDD1, VPP shown in FIG. 3 are supplied to a PMOS transistor P1 within the semiconductor memory device, an undesirable current path may be generated in all of first to sixth cases of FIG. 2. Furthermore, when applied voltages VDD1, VPP, VDD2 and Peri IVC shown in FIG. 4 are supplied as an operating voltage of level shifter, an undesirable current path may be formed in the first, second and fifth cases of FIG. 2. When applied voltages VDD1, VPP, VDD2 and PDPDE shown in FIG. 5 are supplied as an operating voltage of transistor, an undesirable current path may be formed in the second, fourth and fifth cases.

FIGS. 6 to 8 are circuit diagrams to explain the case in which voltages VDD2, PERI/CORE IVC, VDD1, VPP shown in FIG. 3 are supplied to a PMOS transistor P1 within the semiconductor memory device.

FIG. 6 is a sectional view of one PMOS transistor among a plurality of PMOS transistors adapted in a core region of semiconductor memory device. As shown, a PMOS transistor may be formed in an N-well. A voltage VDD1 or VPP may be applied to a P-type bulk. In this example, a current path section as shown in FIG. 10 may be generated.

FIG. 7 illustrates a related art multi-threshold CMOS MTCMOS circuit. FIG. 7 depicts a scheme in which a relatively high threshold voltage is controlled by a bulk bias. A PMOS transistor may be formed in an N-well, and a voltage VCC1 or VPP may be applied to a P-type bulk. In this example, a current path section may be generated as shown in FIG. 10.

FIG. 8 illustrates a row decoder circuit for use in suppressing a gate induced drain leakage (GIDL). In this example, voltage VDD1 or VPP may be applied to a source and a bulk of a PMOS transistor P10 in FIG. 8, voltage VDD2 or IVC may be applied to a source of PMOS transistor P11, and voltage VDD1 or VPP may be applied to a bulk. A current path may be generated as shown in FIG. 10.

Referring to FIG. 10, a current path may be generated during time intervals T1 and T3. In FIG. 10, the first external source voltage VDD1 is assumed to be greater than a voltage level of second external source voltage VDD2, and the second external source voltage VDD2 is assumed to be powered up first. For example, when the first external source voltage VDD1 has a level of about 1.8 V in a normal state, the second external source voltage VDD2 has a level of about 1.35 V. The interval T2 represents a valid region of PDPDE signal. As shown in the interval T1 of FIG. 10, when power-up speeds of the first and second external source voltages VDD1 and VDD2 are different, voltages VPP and IVC generated by an internal DC generator may have a set difference from the generation of the current path.

FIG. 9 illustrates a related art level shifting circuit constructed of a cross-coupled type differential amplifier. FIG. 9 will be used to explain a situation in which voltages VDD1, VPP, VDD2 and Peri IVC shown in FIG. 4 are supplied as an operating voltage of level shifter.

Referring to FIG. 9, the first external source voltage VDD1 may be applied as an operating voltage to source terminal of PMOS transistors P1, P2 and P10 constituting the level shifting circuit. The second external source voltage VDD2 or peri/core IVC may be applied as an operating voltage of input inverter INV10. In this example, a reset voltage level may not be properly determined at level shifting node NO1 because of a generation of current path.

FIG. 11 illustrates timings of voltage waveforms for further explaining the situation in which voltages VDD1, VPP, VDD2 and PDPDE are supplied as an operating voltage of transistor. Referring to FIG. 11, a DPD entry occurs at a time t1 and a current path may be generated. At this time, during the DPD start, a VPP level may not be generated as 0V. As illustrated in NMOS transistor M1 shown in FIG. 11, a level of VPP may be maximum VDD2-1Vtn, and a current path from a source terminal of the transistor M1 to a drain terminal may be formed.

SUMMARY

Example embodiments relate to semiconductor memory devices. For example, example embodiments relate to voltage generating circuits for semiconductor memory devices and voltage supply methods capable of generating required voltages using external source voltages of different levels. Example embodiments of semiconductor memory devices may have an improved power distribution structure.

At least one example embodiment provides a voltage generating circuit for a semiconductor memory device capable of generating a higher output voltage using at least two types of external source voltages, and a voltage supply method for the same. Example embodiments may suppress and/or prevent generation of a current path resulting from the use of multiple source voltages and a required internal voltage in the semiconductor memory device. Power may be distributed more efficiently when multiple source voltages are received and an internal voltage for operating, for example, a mobile oriented semiconductor memory device may be produced.

At least one other example embodiment provides a voltage generating circuit using multiple external source voltages, capable of suppressing and/or preventing generation of a current path inside a memory device (e.g., a dynamic random access memory (DRAM)) even when using at least two types of external source voltages (or external voltage sources). Reliability in a power supply operation of semiconductor memory devices may also be improved.

According to at least one example embodiment, a voltage generating circuit for a semiconductor memory device may include first and second reset signal generators. The first and second rest signal generators may generate first and second reset signals in response to first and second external source voltages having different voltage levels. An output voltage generator may generate first and second output voltages by independently driving the first and second external source voltages in response to the first and second reset signals. The first and second output voltages may be output through a common output terminal.

At least one other example embodiment provides a voltage generating circuit for a semiconductor memory device including a plurality of reset signal generators and an output voltage generator. Each of the plurality of reset signal generators may generate a reset signal in response to one of a plurality of external source voltages. The plurality of external source voltages may have different voltage levels. The output voltage generator may generate a plurality of output voltage signals by independently driving each of the plurality of external source voltages in response to a corresponding one of the plurality of reset signals. The output voltage generator may output the plurality of output voltage signals through a common output terminal.

According to at least some example embodiments, the output voltage generator may include a first voltage generator and a second voltage generator. The first voltage generator may include a first inverter, a first PMOS transistor and a first NMOS transistor. The first inverter may receive the first external source voltage as an operating voltage, and invert the first reset signal. The first PMOS transistor may drive the first external source voltage applied to a source terminal in response to an output of the first inverter. The first NMOS transistor may have a gate terminal and drain terminal connected to a drain terminal of the first PMOS transistor and a source terminal connected to the common output terminal. The first NMOS transistor may generate the first output voltage through the common output terminal. The second voltage generator may include a second inverter, a second PMOS transistor and a second NMOS transistor. The second inverter may receive the second external source voltage as an operating voltage and invert the second reset signal. A second PMOS transistor may drive the second external source voltage applied to a source terminal in response to an output of the second inverter. The second NMOS transistor may have a gate terminal and drain terminal connected to a drain terminal of the second PMOS transistor and a source terminal connected to the common output terminal. The second NMOS transistor may generate the second output voltage through the common output terminal.

According to at least some example embodiments, the first external source voltage may have a relatively high potential as compared to the second external source voltage in a normal state, and the output voltage may be provided to a word line for accessing a row of memory cell. The voltage generating circuit may further include a power-down control signal generator operating in response to the first reset signal. The power-down control signal generator may receive the first external source voltage as an operating voltage, and generate a power-down control signal for entering a power-down mode.

According to at least some example embodiments, the voltage generating circuit may further include a reference voltage generator connected to the power-down control signal generator. The reference voltage generator may receive the first external source voltage as an operating voltage and generate a reference voltage for a high voltage generator or internal source voltage generator of the semiconductor memory device. The voltage generating circuit may further include a level shifter. The level shifter may operate in response to the first reset signal. For example, the level shifter may receive the first external source voltage as an operating voltage and generate a level shifted output voltage.

According to at least some example embodiments, the internal source voltage generator may receive the second external source voltage as an operating voltage and generate an internal source voltage. The level shifter may include a reset transistor having a drain-source channel coupled between a level shifting node and ground, and a gate terminal receiving the first reset signal.

At least one other example embodiment provides a method of supplying a using voltage in a semiconductor memory device. According to at least this example embodiment, first and second external source voltages having different voltage levels may be received, and first and second reset signals may be generated in response to the first and second external source voltages. The first reset signal may be received as an activation signal. The first external source voltage may be driven to generate a first output voltage. The second reset signal may be received as an activation signal, and the second external source voltage may be driven to generate a second output voltage. The first and second output voltages may be output to a voltage using circuit through a common output terminal.

At least one other example embodiment provides a method of supplying a voltage in a semiconductor memory device. In at least this example embodiment, a plurality of reset signals corresponding to the plurality of external source voltages may be generated, and a first of the plurality of external source voltages may be driven to generate a first output voltage in response to a first of the plurality of reset signals. A second of the plurality of external source voltages may be driven to generate a second output voltage in response to a second of the plurality of reset signals. The first and second output voltages may be output to a voltage using circuit through a common output terminal.

According to at least some example embodiments, the voltage using circuit may be a word line driver. When the first external source voltage has a level of about 1.8 V (e.g., in a normal state), the second external source voltage may have a level of about 1.35V.

According to at least some example embodiments, a power-down control signal may be generated and activated in response to the first reset signal. The power-down control signal may be used to enter a power-down mode of the semiconductor memory device by using the first external source voltage as an operating voltage. A reference voltage may be generated using the first external source voltage as an operating voltage. The reference voltage may be deactivated by the power-down control signal and may be necessary for a voltage generator or internal source voltage generator of the semiconductor memory device.

In methods and circuits according to example embodiments, a current path may not occur in internal circuits of the semiconductor memory device even when multiple external source voltages are used, thereby performing a more efficient and/or reliable power distribution.

BRIEF DESCRIPTION OF THE DRAWINGS

Example embodiments will be apparent from the more particular description of the example embodiments, as illustrated in the accompanying drawings in which like reference characters refer to the same parts throughout the different views, in which:

FIG. 2 is a table illustrating example cases of a voltage supply shown in FIG. 1;

DETAILED DESCRIPTION OF EXAMPLE EMBODIMENTS

Figure 1:
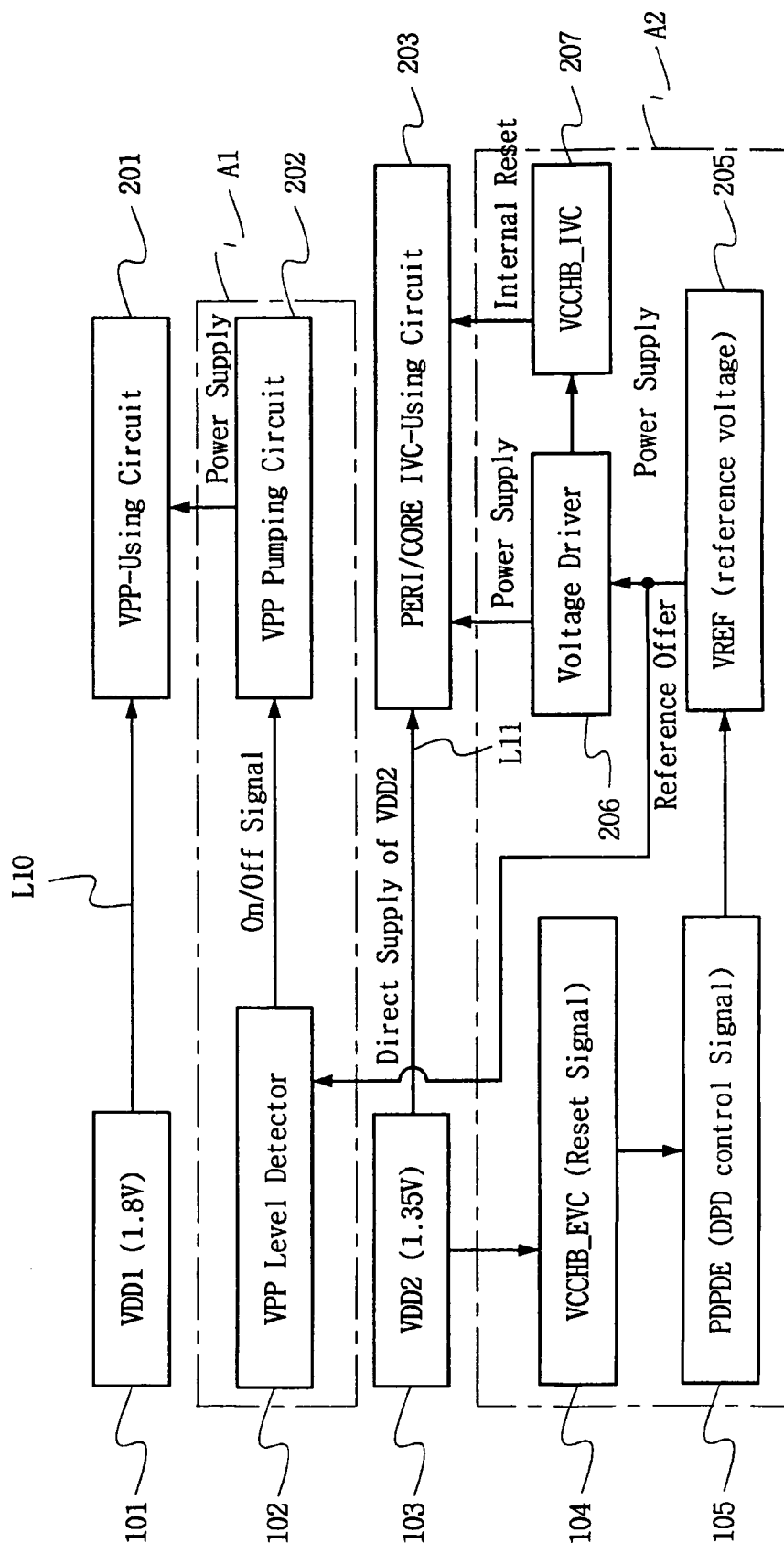
FIG. 1 is a block diagram of a conventional voltage supply system in a conventional semiconductor memory device.
Figure 3:
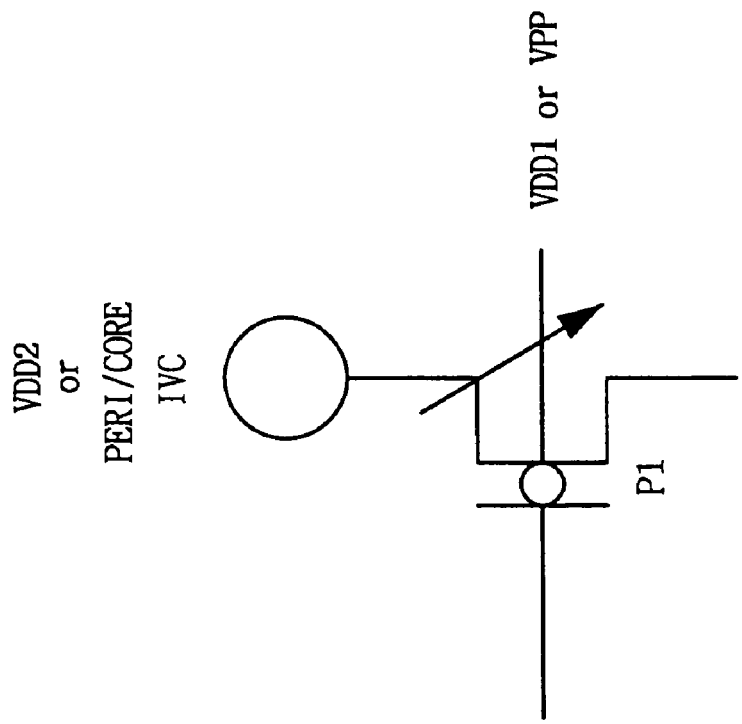
FIGS. 3 to 5 are circuit diagrams illustrating portions of the conventional voltage supply system of FIG. 1.
Figure 4:
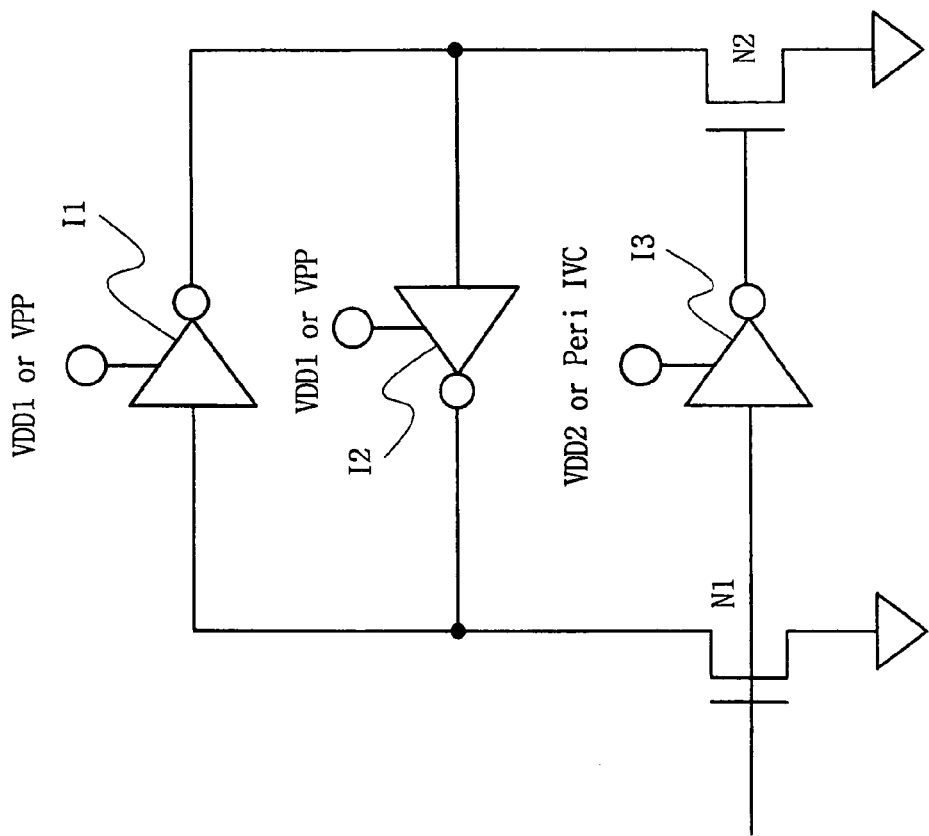
Figure 5:
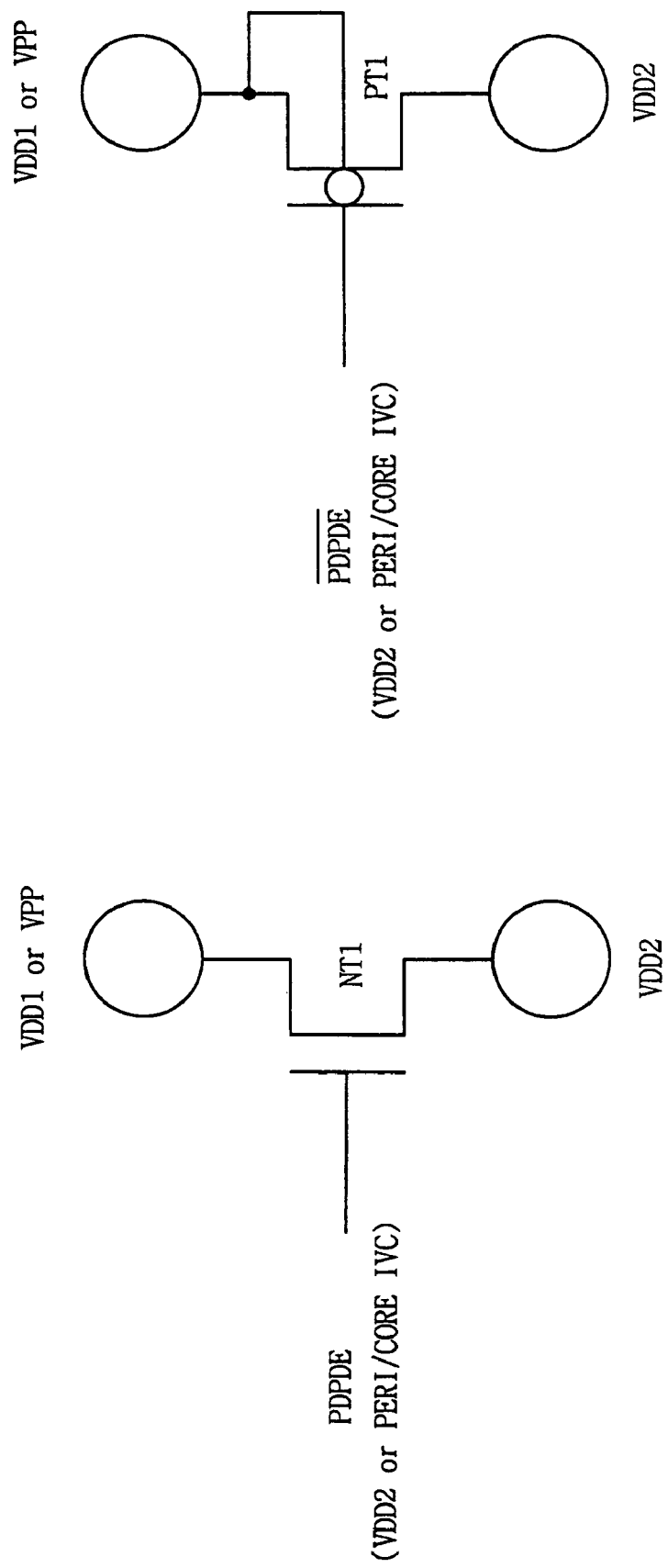
Figure 6:
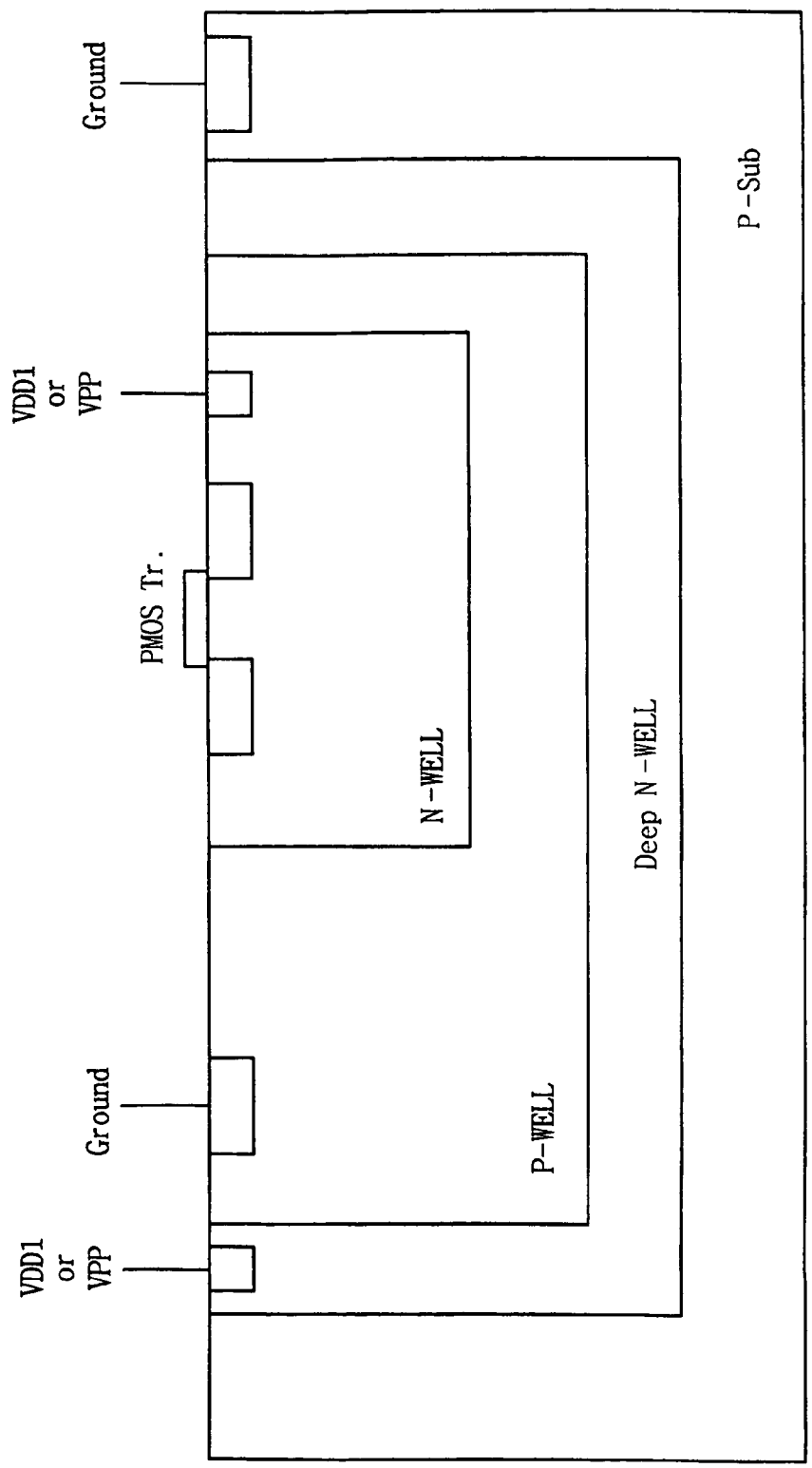
FIG. 6 is a cross-sectional view of a portion of the conventional voltage supply system of FIG. 1.
Figure 7:
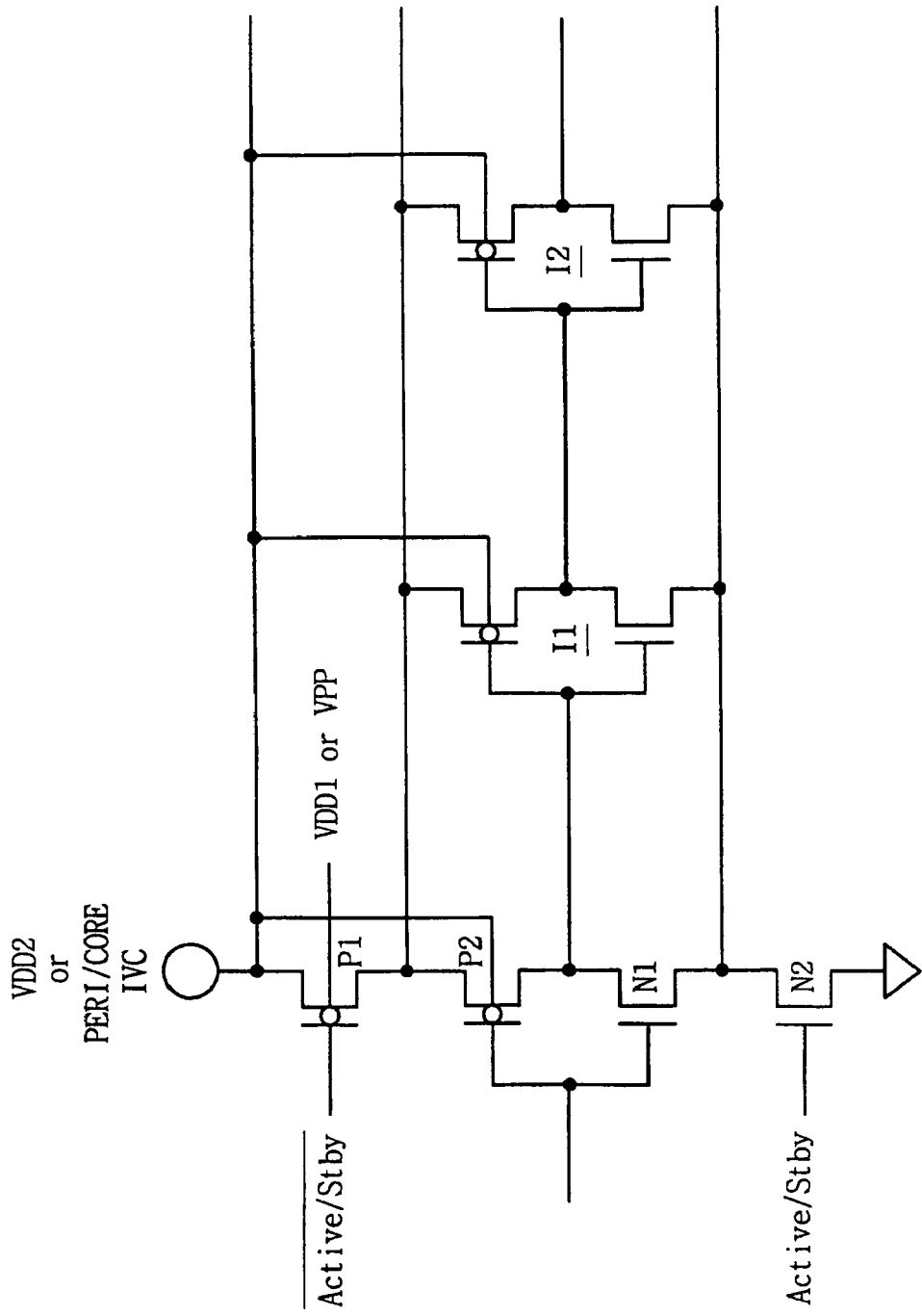
FIGS. 7 and 8 are circuit diagrams illustrating portions of the conventional voltage supply system of FIG. 1.
Figure 8:
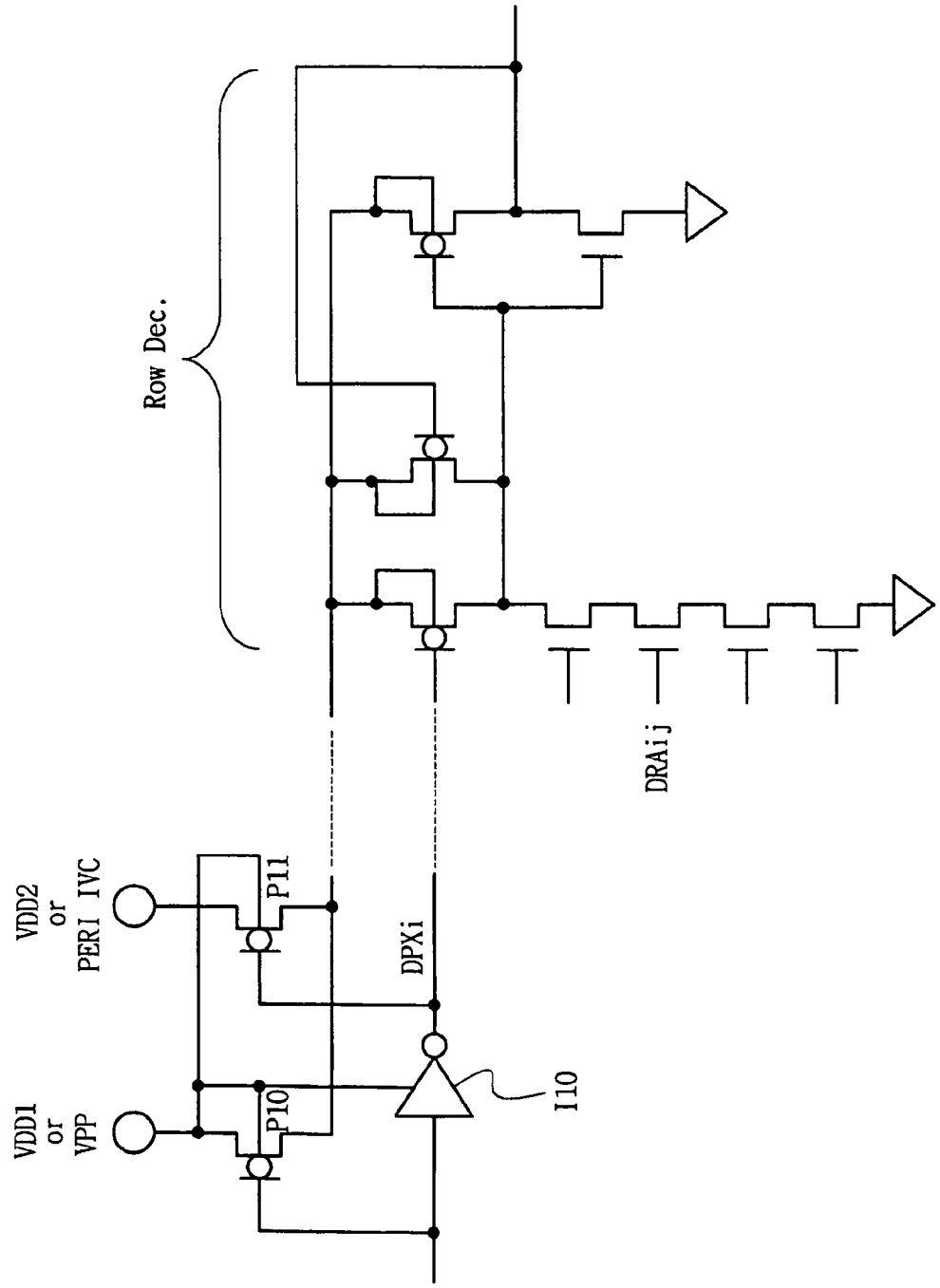

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 12:
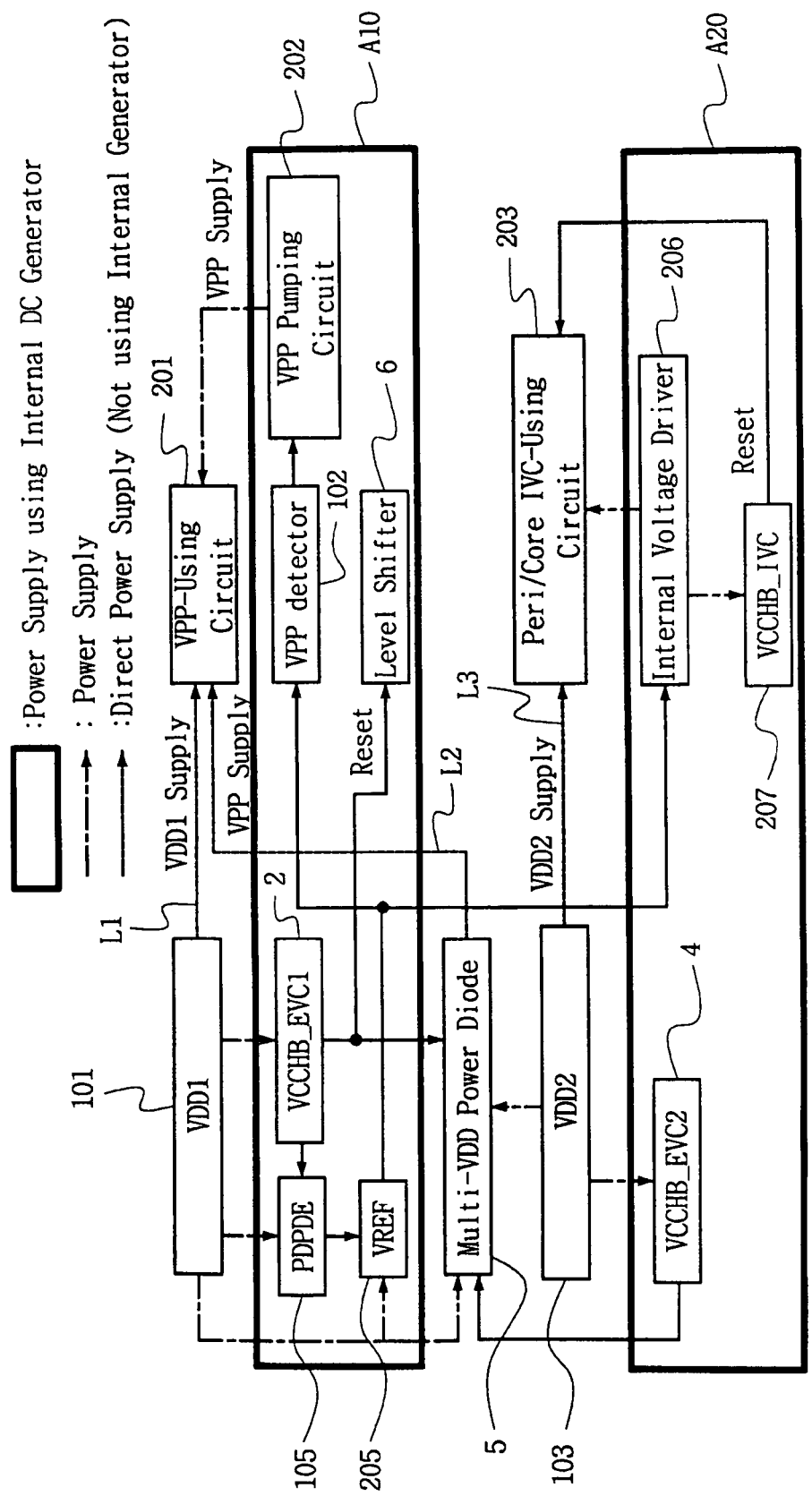
FIG. 12 is a block diagram of voltage supply system for use in a semiconductor memory device according to an example embodiment.
Figure 13:
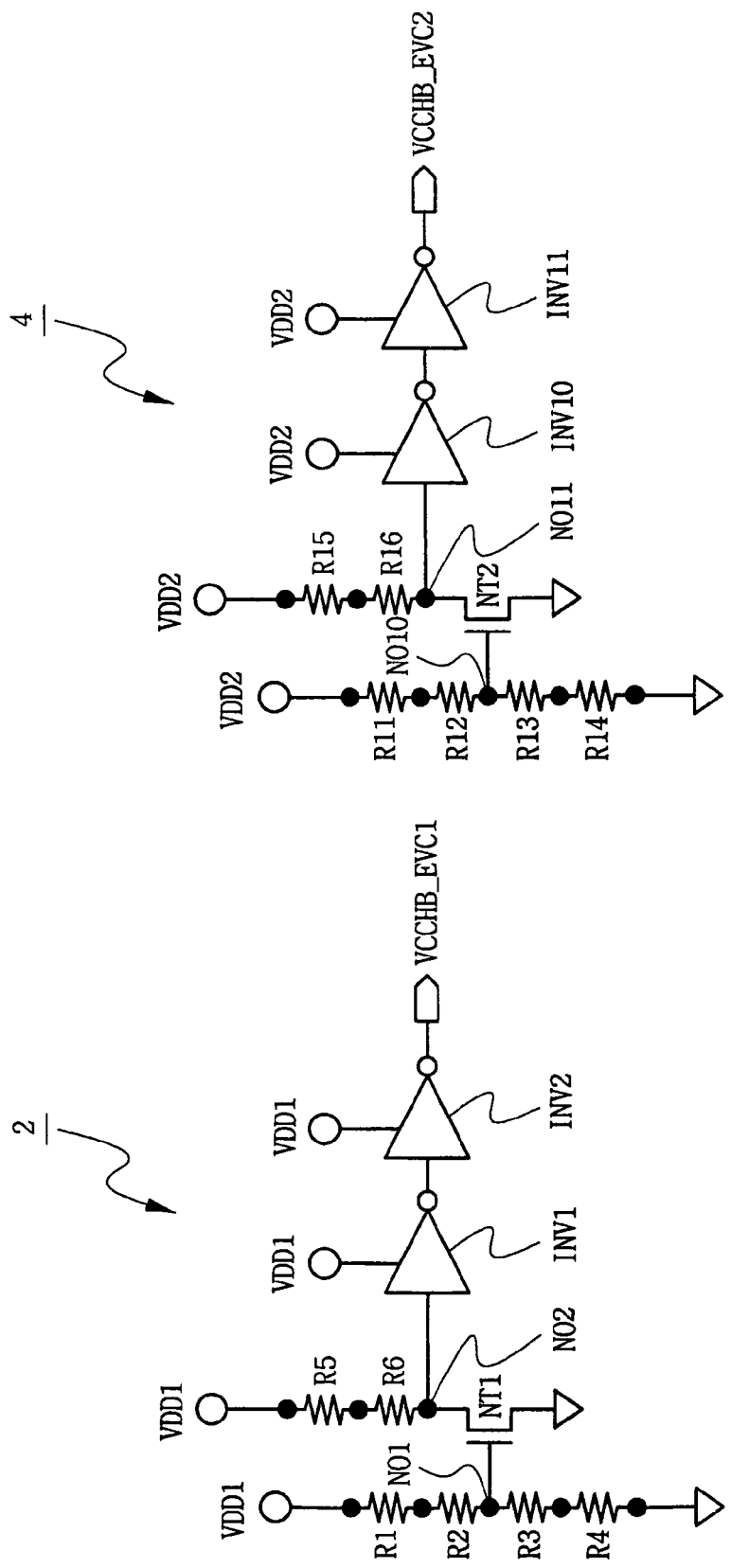
FIG. 13 is a circuit diagram illustrating an example embodiment of first and second reset signal generators.
Figure 14:
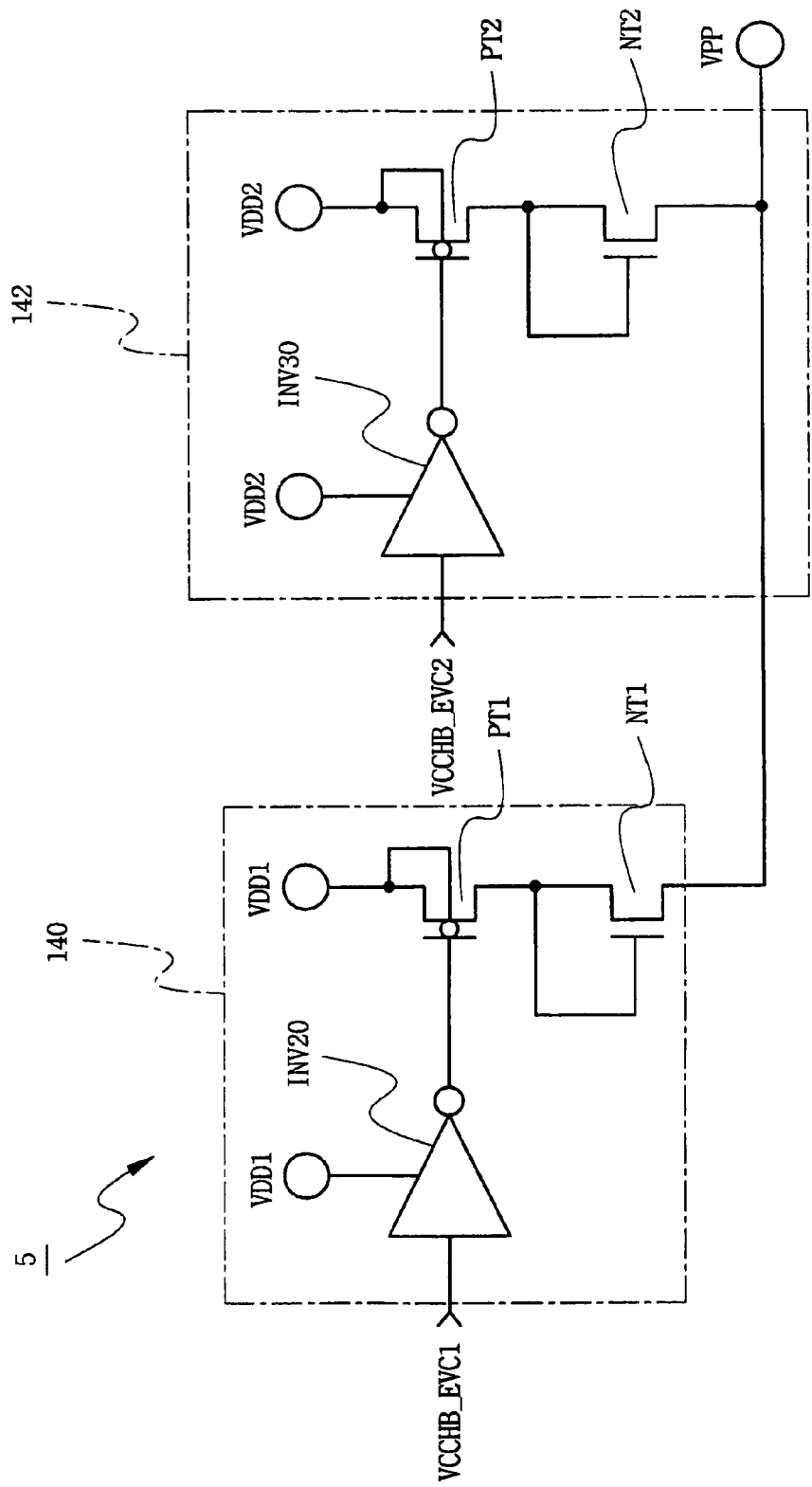
FIG. 14 is a circuit diagram illustrating an example embodiment of a high voltage generator.
Figure 15:
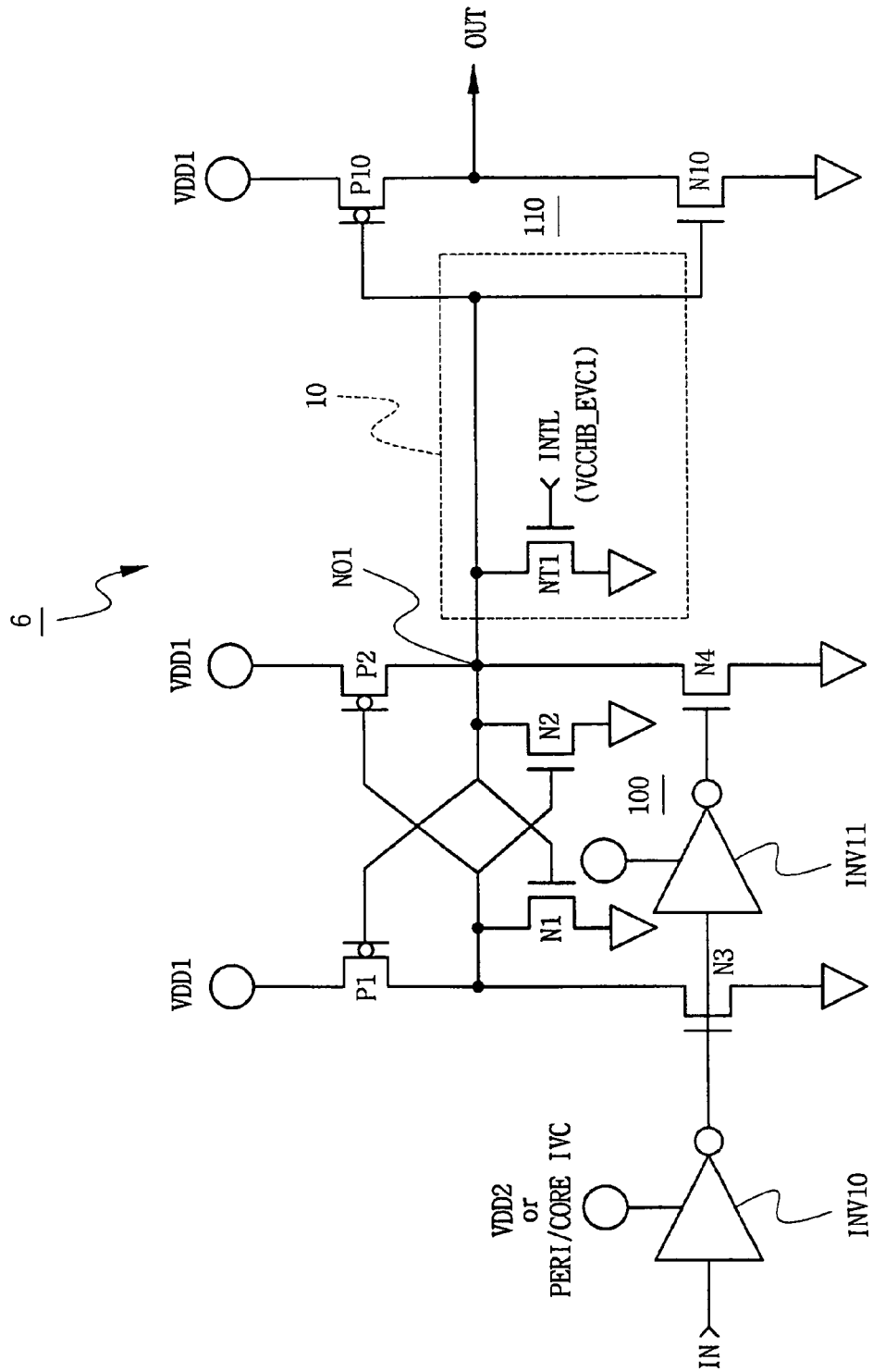
FIG. 15 is a circuit diagram illustrating an example embodiment of a level shifter.
Figure 16:
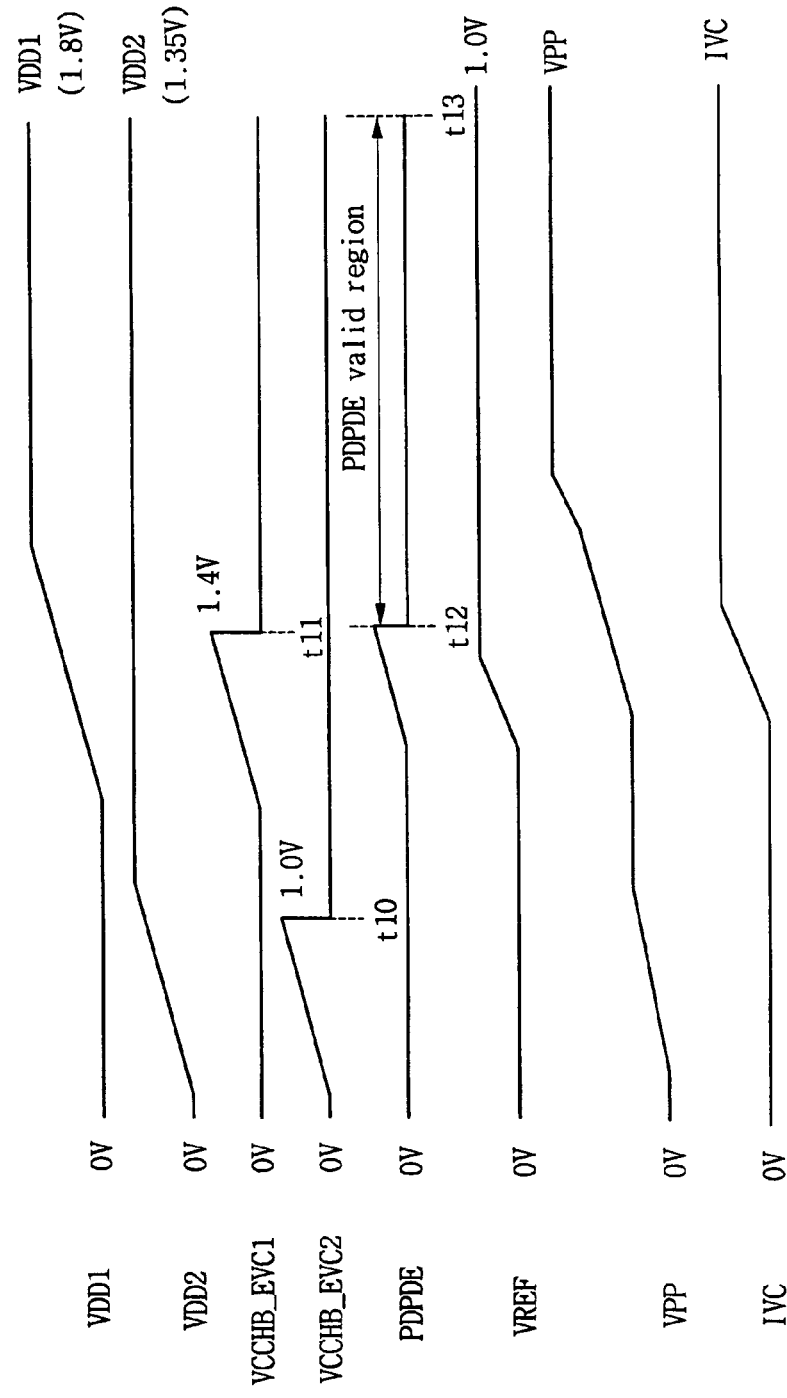
FIG. 16 illustrates timings of voltage waveforms associated with an example embodiment.
Figure 17:
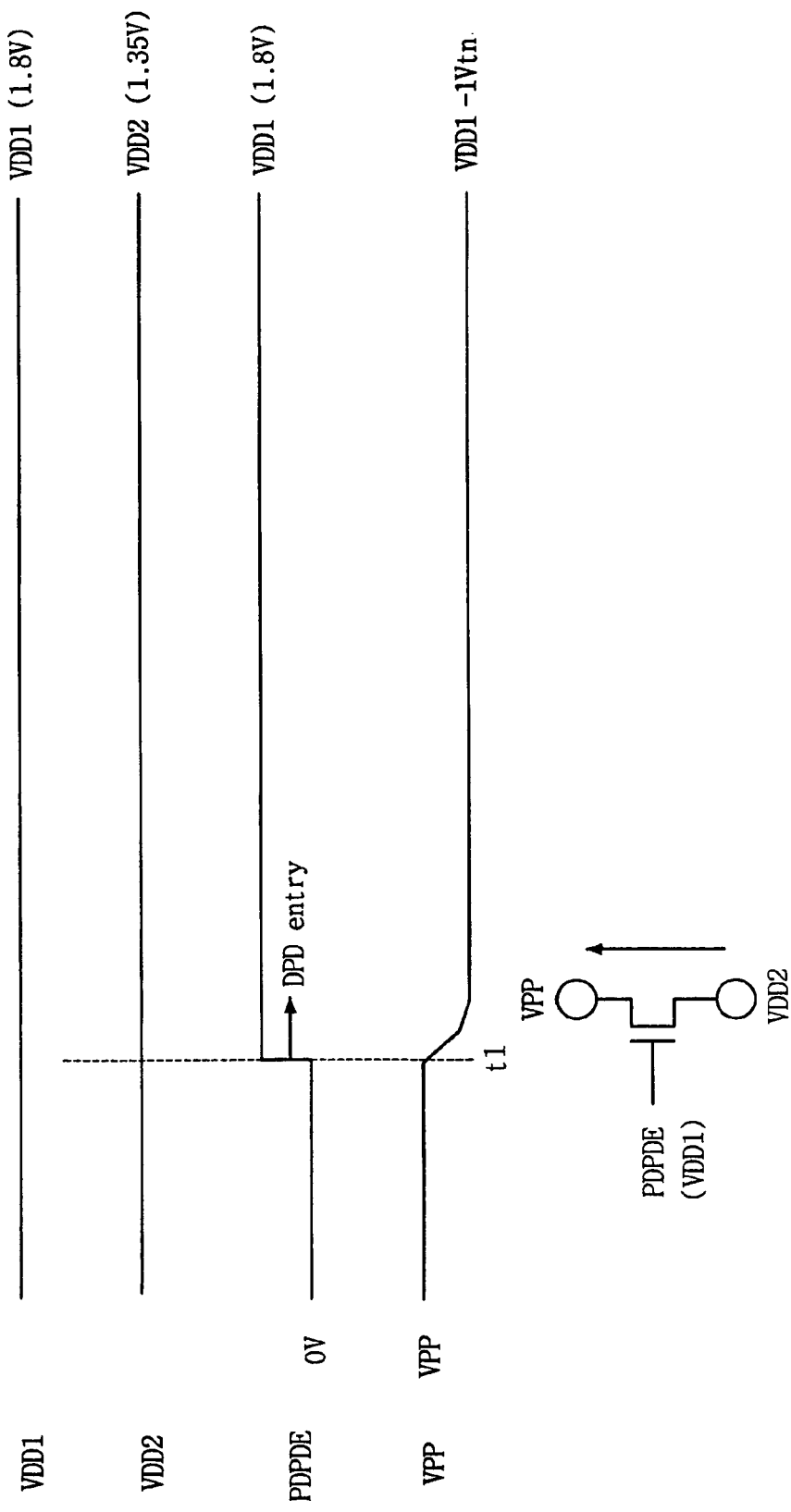
FIG. 17 depicts timings of voltage waveforms associated with an example embodiment.

Example embodiments will be described referring to FIGS. 12 to 17. FIG. 12 is a block diagram of voltage supply system according to an example embodiment. The voltage supply system may also be referred to as a voltage generating circuit. FIG. 13 is a circuit diagram illustrating a first and second reset signal generators according to an example embodiment. FIG. 14 is a circuit diagram illustrating an output voltage generator according to an example embodiment. FIG. 15 is a circuit diagram illustrating a level shifter according to an example embodiment. FIGS. 16 and 17 illustrate timings of voltage waveforms associated with the voltage supply system of FIG. 12.

Referring to FIG. 12, first and second external source voltages VDD1 101 and VDD2 103 may have different voltage levels. The first external source voltage VDD1 101 may be supplied (e.g., directly supplied) to circuit 201 using high voltage VPP through a supply line L1. The second external source voltage VDD2 103 may be supplied (e.g., directly supplied) to a peripheral circuit or core circuit 203 using internal source voltage IVC through a supply line L3. Regions A10 and A20 may constitute a distribution system for supplying power using an internal DC generator of semiconductor memory device according to an example embodiment. In region A10, a first reset signal generator 2 may produce a first reset signal in response to the first external source voltage VDD1. The first reset signal may be applied to a PDPDE generator 105, a level shifter 6 and an output voltage generator 5. The PDPDE generator 105 may generate a power-down (DPD) control signal. The PDPDE generator 105 may be coupled with the first reset signal and the first external source voltage VDD1 101. In a power-down operation, the PDPDE generator 105 may apply a power-down (DPD) control signal to reference voltage generator 205. A power-down operation may be controlled by the power-down control signal in the reference voltage generator 205. The reference voltage generator 205 may produce a reference voltage and supply the reference voltage to a voltage driver 206 and the high voltage level detector 102. Output voltage driven by the voltage driver 206 may be supplied to the peripheral circuit/core circuit 203 and the internal reset circuit 207. The internal reset circuit 207 may generate an internal reset signal and apply the internal reset signal to the peripheral circuit/core circuit 203.

An on/off signal output from high voltage level detector 102 may be applied to high voltage pumping circuit 202 as a pumping activation signal. The high voltage pumping circuit 202 may supply a pumping voltage to the VPP-using circuit 201.

In region A20, a second reset signal generator 4 may generate a second reset signal in response to the second external source voltage VDD2. The second reset signal may be applied to the output voltage generator 5.

The output voltage generator (e.g., multi-VDD power diode) 5 in FIG. 12 may generate first and second output voltages by driving (e.g., independently driving) the first and second external source voltage VDD1 and VDD2 in response to the first or second reset signal. The output voltage generator 5 may output an output voltage VPP through a common output terminal.

In the voltage supply system illustrated in FIG. 12, even when using multiple external source voltages, formation of undesirable current paths may be suppressed and/or prevented in various internal circuits of a semiconductor memory device, thereby distributing power more efficiently with suppressed supply operation errors.

FIG. 13 illustrates an example embodiment of a first signal generator 2 and an example embodiment of a second signal generator 4 in more detail.

Referring to FIG. 13, first reset signal generator 2 may include a plurality of resistors R1-R6, a transistor (e.g., an NMOS transistor) NT1, and inverters INV1 and INV2, with a wiring structure as shown. Second reset signal generator 4 may include a plurality of resistors R11-R16, a transistor (e.g., an NMOS transistor) NT2 and inverters INV10 and INV11, with a wiring structure as shown. The first reset signal generator 2 may receive the first external source voltage VDD1 as an operating voltage, and may generate a first reset signal such as a waveform VCCHB_EVC1 shown in FIG. 16. The second reset signal generator 4 may receive the second external source voltage VDD2 as an operating voltage, and may generate a second reset signal such as a waveform VCCHB_EVC2 shown in FIG. 16.

Example of the output voltage generator 5 shown in FIG. 12 is illustrated in FIG. 14. With reference to FIG. 14, a first voltage generator 140 and a second voltage generator 142 may constitute the output voltage generator 5 (e.g., a multi-VDD power diode).

The first voltage generator 140 may include a first inverter INV20, a transistor (e.g., PMOS transistor) PT1 and a transistor (e.g., NMOS transistor) NT1. The first inverter INV20 may receive the first external source voltage VDD1 as an operating voltage and invert the first reset signal VCCHB_EVC1. The first PMOS transistor PT1 may drive the first external source voltage VDD1 applied to a source terminal in response to an output of the first inverter INV20. The first NMOS transistor NT1 may have a gate terminal and drain terminal coupled to a drain terminal of the first transistor PT1, and a source terminal coupled to the common output terminal VPP. The transistor NT1 may generate the first output voltage through the common output terminal.

The second voltage generator 142 may include a second inverter INV30, a transistor (e.g., PMOS transistor) PT2 and a transistor (e.g., NMOS transistor) NT2. The second inverter INV30 may receive the second external source voltage VDD2 as an operating voltage, and invert the second reset signal VCCHB_EVC2. The transistor PT2 may drive the second external source voltage VDD2 applied to a source terminal in response to an output of the second inverter INV30. The second NMOS transistor NT2 may have a gate terminal and drain terminal coupled to a drain terminal of the transistor PT2, and a source terminal may be coupled to the common output terminal. The second NMOS transistor NT2 may generate the second output voltage through the common output terminal VPP.

The output voltage generated in the common output terminal of FIG. 14 may correspond to waveform VPP of FIG. 16.

Figure 9:
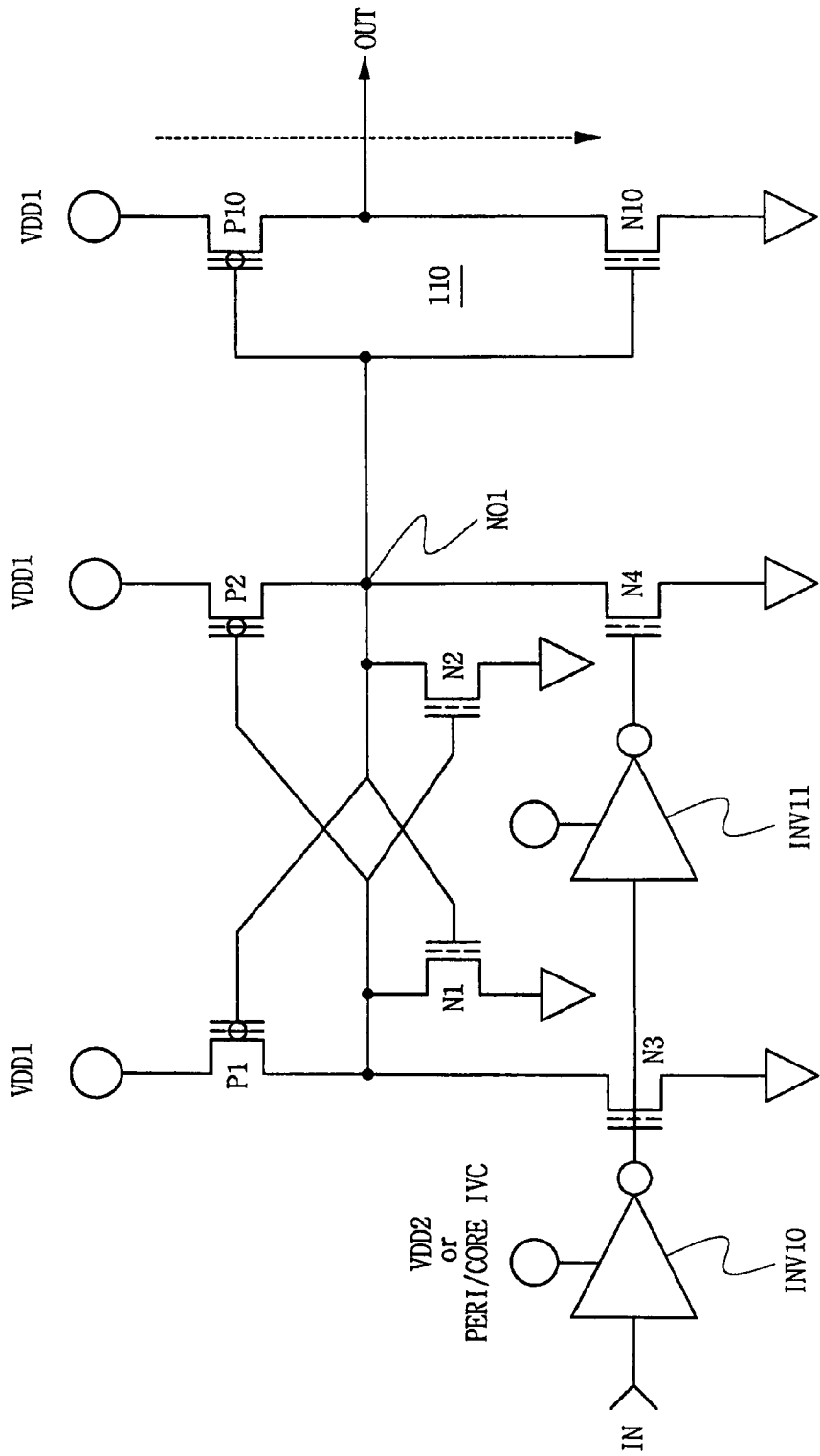
FIG. 9 is a circuit diagram to illustrating a portion of the conventional voltage supply system of FIG. 1.
Figure 10:
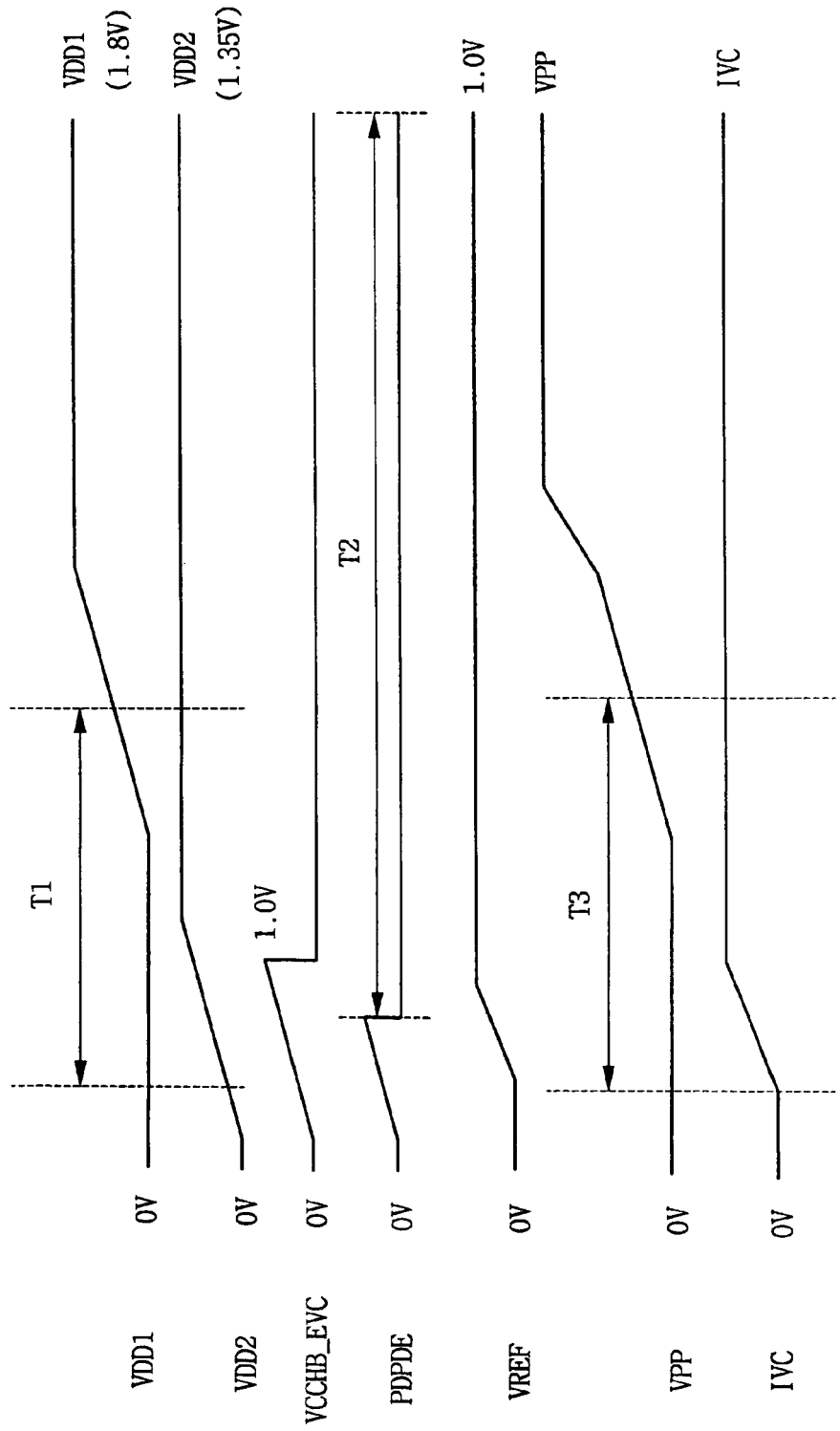
FIG. 10 illustrates timings of voltage waveforms associated with the conventional voltage supply system of FIG. 1.

An example embodiment of the level shifter 6 referred to FIG. 12 is illustrated in FIG. 15. With reference to FIG. 15, a reset circuit or unit 10 including transistor (e.g., NMOS transistor) NT1 may be added to the level shifter shown in FIG. 9. The first reset signal VCCHB_EVC1 may be applied as a reset voltage INTL to a gate of the transistor NT1, and thus, a potential of level shifting node NO1 during a power-up operation may be set to ground. Accordingly, a current path caused by an output drive inverter 110 as illustrated in FIG. 9 may be suppressed and/or prevented in FIG. 15. Referring to timings shown in FIG. 16, assuming the first external source voltage VDD1 is greater than a voltage level of the second external source voltage VDD2 and the second external source voltage VDD2 is powered up first as in FIG. 10, voltages VPP and IVC in FIG. 16 may be different from the level shown during an interval T3 of FIG. 10. Accordingly, even when speeds of the first and second external source voltages VDD1 and VDD2 set during power-up are different as shown during interval T1 of FIG. 10, generation of an undesirable current path in the circuit may be suppressed and/or prevented. When the first external source voltage VDD1 has a level of about 1.8 V in a normal state, the second external source voltage VDD2 may have a level of about 1.35 V. A valid region of PDPDE signal shown in FIG. 16 may be decreased as compared with the interval T2 of FIG. 10. Time points t11 and t10 each indicate a time point at which the first or second reset signal VCCHB_EVC1 or VCCHB_EVC2 transitions from a high level to a low level.

Consequently, in FIG. 16, even when the first external source voltage VDD1 is higher than a voltage level of the second external source voltage VDD2 and the second external source voltage VDD2 is powered up earlier than the first external source voltage VDD1, an undesirable current path may not be formed in an internal circuit and the supply system may distribute power more efficiently.

Figure 11:
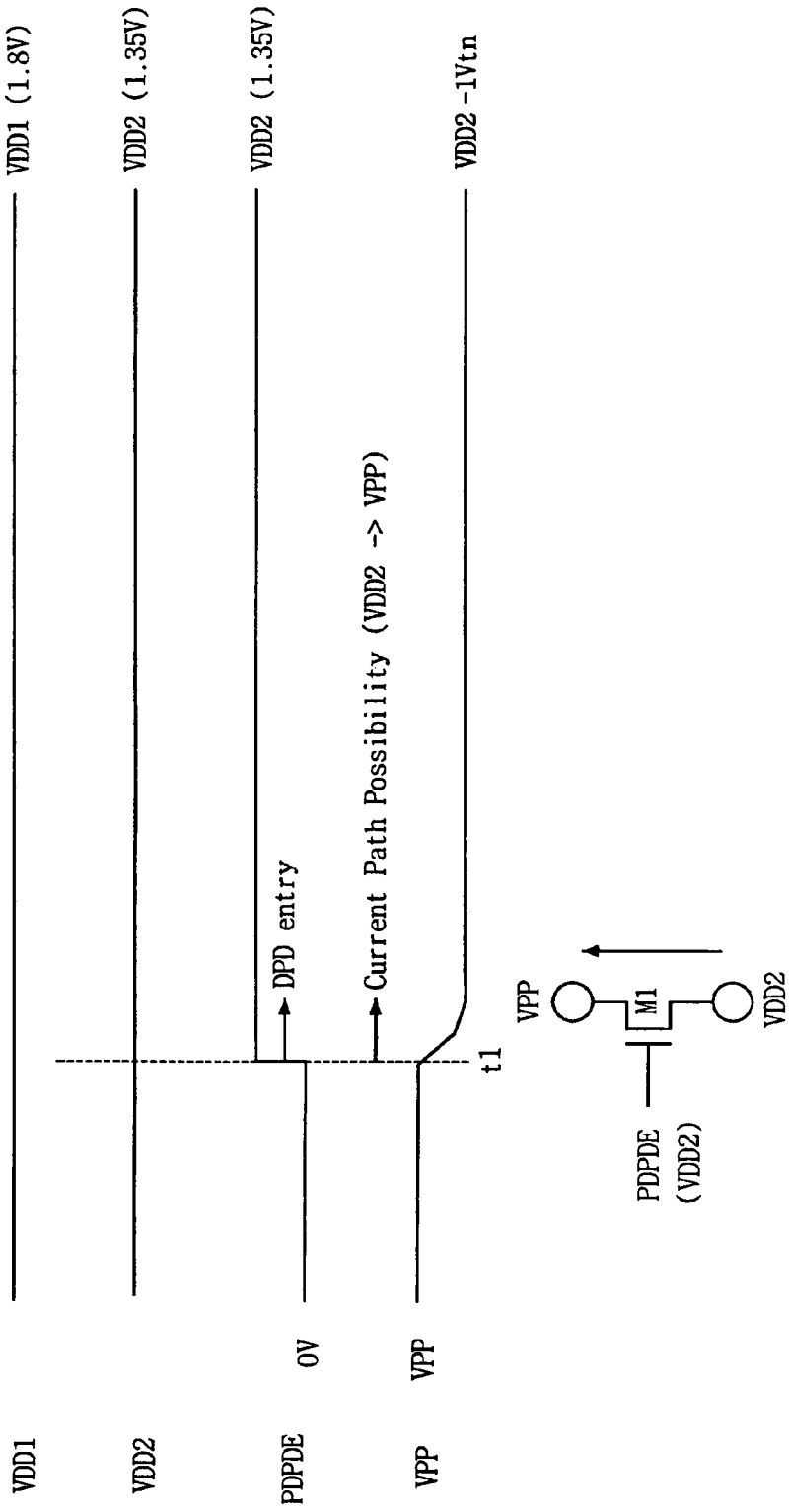
FIG. 11 illustrates timings of voltage waveforms associated with the conventional voltage supply system of FIG. 1.

FIG. 17 illustrates example timings of voltage waveforms associated with an example embodiment. Though a DPD entry occurs at a time point t1 in FIG. 17, generation of an undesirable current path may still be suppressed and/or prevented. As illustrated herein, a maximum level of voltage VPP after the time point t1 may be VDD1-1Vtn, and thus, formation of an undesirable current path from a source terminal VDD2 of the transistor to a drain terminal VPP may be suppressed and/or prevented. Unlike FIG. 11, therefore, current may not flow backward to the transistor after the DPD entry.

According to at least some example embodiments, the multiple external source voltages may be provided by one or more external voltage sources. For example, each of a plurality of external voltage sources may generate one of the plurality of external source voltages. Alternatively, a single external voltage source may generate the plurality of external source voltages.

As described above, in example embodiments of voltage generating circuits and voltage supply methods even when using multiple external source voltages, an undesirable current path may not be generated in various internal circuits of the semiconductor memory device. Accordingly, power distribution may be performed more efficiently and/or supply operation errors may be suppressed and/or prevented. In addition, an output voltage may be produced by using at least two external source voltages, thereby providing a more reliable semiconductor memory device.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, an internally connected structure of voltage generating circuit may be changed diversely. Accordingly, these and other changes and modifications are seen to be within the true spirit and scope of the invention as defined by the appended claims.

In the drawings and specification, there have been disclosed example embodiments, and although specific terms are employed, they are used in a generic and descriptive sense only and not for purposes of limitation, the scope of the invention being set forth in the following claims.

What is claimed is:

1. A voltage generating circuit for a semiconductor memory device, comprising:
    a plurality of reset signal generators, each of the plurality of reset signal generators being configured to generate a reset signal in response to one of a plurality of external source voltages, the plurality of external source voltages having different voltage levels; and
    an output voltage generator configured to generate a plurality of output voltage signals by independently driving each of the plurality of external source voltages in response to a corresponding one of the plurality of reset signals, the output voltage generator being further configured to output the plurality of output voltage signals through a common output terminal.

2. The circuit of claim 1, wherein the plurality of reset signals includes a first and second reset signal, the plurality of external source voltages includes a first external source voltage and a second external source voltage and the plurality of output voltage signals includes a first output voltage signal and a second output voltage signal, the output voltage generator including,
    a first voltage generator configured to generate the first output voltage signal based on the first reset signal and the first external source voltage, and
    a second voltage generator configured to generate the second output voltage signal based on the second reset signal and the second external source voltage.

3. The circuit of claim 2, wherein the first voltage generator includes, an inverter configured to generate the first output voltage signal by inverting the first reset signal in response to the first external source voltage,
    a first transistor configured to drive the first external source voltage in response to the first output voltage signal, the first external source voltage being applied to a source terminal of the first transistor, and
    a second transistor having a gate terminal and drain terminal coupled to a drain terminal of the first transistor, the second transistor having a source terminal coupled to the common output terminal, and being configured to output the first output voltage signal via the common output terminal.

4. The circuit of claim 2, wherein the second voltage generator includes,
    an inverter configured to generate the second output voltage signal by inverting the second reset signal in response to the second external source voltage,
    a first transistor configured to drive the second external source voltage in response to the second output voltage signal, the second external source voltage being applied to a source terminal of the first transistor, and a second transistor having a gate terminal and drain terminal coupled to a drain terminal of the first transistor, the second transistor having a source terminal coupled to the common output terminal, and being configured to output the second output voltage signal via the common output terminal.

5. The circuit of claim 2, wherein the first external source voltage has a higher potential than the second external source voltage.

6. The circuit of claim 1, wherein the plurality of output voltage signals are output to a word line for accessing to a row of memory cell.

7. The circuit of claim 1, further including, a power-down control signal generator configured to operate in response to a first of the plurality of reset signals, the power-down control signal generator being further configured to receive a first of the plurality of external source voltages as an operating voltage and generate a power-down control signal, the power-down control signal being associated with a power-down mode of the semiconductor memory device.

8. The circuit of claim 7, further including, a reference voltage generator coupled to the power-down control signal generator, the reference voltage generator being configured to receive the first of the plurality of external source voltages as an operating voltage, and generate a reference voltage for a voltage generator or internal source voltage generator of the semiconductor memory device.

9. The circuit of claim 8, wherein the internal source voltage generator receives a second of the plurality of external source voltages as an operating voltage and generates an internal source voltage.

10. The circuit of claim 1, further including, a level shifter configured to operate in response to a first of the plurality of reset signals, the level shifter being further configured to receive a first of the plurality of external source voltages as an operating voltage, and generate a level shifted output voltage.

11. The circuit of claim 10, wherein the level shifter includes, a reset transistor having a drain-source channel coupled between a level shifting node and ground, the reset transistor having a gate terminal for receiving the first of the plurality of reset signals.

12. A method of supplying a voltage in a semiconductor memory device, the method comprising:

generating a plurality of reset signals corresponding to a plurality of external source voltages, each of the plurality of external source voltages having a different voltage level;

driving a first of the plurality of external source voltages to generate a first output voltage in response to a first of the plurality of reset signals;

driving a second of the plurality of external source voltages to generate a second output voltage in response to a second of the plurality of reset signals; and outputting the first and second output voltages to a voltage using circuit through a common output terminal.

13. The method of claim 12, wherein the voltage using circuit is a word line driver.

14. The method of claim 12, wherein the first of the plurality of external source voltages has a level of about 1.8 V and the second of the plurality of external source voltages has a level of about 1.35V.

15. The method of claim 12, further including, generating a power-down control signal for entering a power-down mode of the semiconductor memory device using the first of the plurality of external source voltages as an operating voltage, the power-down control signal being generated in response to the first of the plurality of reset signals.

16. The method of claim 15, further including, generating a reference voltage for a voltage generator or internal source voltage generator of the semiconductor memory device using the first of the plurality of external source voltages as an operating voltage, the reference voltage being deactivated by the power-down control signal.

17. The method of claim 16, further including, generating a level shifted output voltage using the first of the plurality of external source voltages as an operating voltage in response to the first of the plurality of reset signals.

* * * * *